US011047886B2

(12) United States Patent
    Mizuno

(10) Patent No.: US 11,047,886 B2
(45) Date of Patent: Jun. 29, 2021

(54) MEASUREMENT DEVICE, MEASUREMENT SYSTEM, MEASUREMENT METHOD, AND PROGRAM

(71) Applicant: Zensho Holdings Co., Ltd., Tokyo (JP)

(72) Inventor: Seiichi Mizuno, Tokyo (JP)

(73) Assignee: Zensho Holdings Co., Ltd., Tokyo (JP)

( * ) Notice: Subject to any disclaimer, the term of this patent is extended or adjusted under 35 U.S.C. 154(b) by 15 days.

(21) Appl. No.: 16/478,540

(22) PCT Filed: Jan. 17, 2018

(86) PCT No.: PCT/JP2018/001226
    § 371 (c)(1),
    (2) Date: Jul. 17, 2019

(87) PCT Pub. No.: WO2018/135532
    PCT Pub. Date: Jul. 26, 2018

(65) Prior Publication Data
    US 2020/0049739 A1    Feb. 13, 2020

(30) Foreign Application Priority Data
    Jan. 17, 2017  (JP) .............................. JP2017-005919

(51) Int. Cl.
    *G01R 17/02*    (2006.01)
    *H04W 4/80*    (2018.01)
    (Continued)

(52) U.S. Cl.
    CPC .......... *G01R 17/02* (2013.01); *G01R 19/165* (2013.01); *G06F 1/3206* (2013.01); *H04W 4/80* (2018.02)

(58) Field of Classification Search
    CPC ............ G01R 19/165; G01R 19/16538; G01R 19/2509; G01R 19/14; G01R 19/18;
    (Continued)

(56) References Cited

U.S. PATENT DOCUMENTS 5,350,237 A    9/1994 Hida
5,841,204 A    11/1998 English
(Continued)

FOREIGN PATENT DOCUMENTS

CN    1085658 A    4/1994
CN    1961217 A    5/2007
(Continued)

OTHER PUBLICATIONS

The First Office Action dated Aug. 3, 2020, of counterpart Chinese Application No. 201880007368.7, along with an English translation.
(Continued)

*Primary Examiner* — Thang X Le
(74) *Attorney, Agent, or Firm* — DLA Piper LLP (US)

(57) ABSTRACT

A measurement device includes a sensor unit capable of measuring a state of a measurement target, and a control unit configured to control the sensor unit. The sensor unit includes a measurement unit capable of measuring a voltage corresponding to the state of the measurement target, a first voltage comparison unit configured to determine whether or not the measured voltage is changed beyond a lower limit value of a predetermined voltage change, and a second voltage comparison unit configured to determine whether or not the voltage change is changed beyond an upper limit value of the voltage change. The control unit stops power supply to the sensor unit in a case in which it is determined in the first and second voltage comparison units that the measured voltage is not changed beyond the voltage change.

10 Claims, 6 Drawing Sheets

(51) Int. Cl.
*G01R 19/165* (2006.01)
*G06F 1/3206* (2019.01)

(58) Field of Classification Search
CPC ........ G01R 19/20; G01R 19/25; G01R 15/18; G01R 15/09; G01R 15/125; G01R 15/08; G01R 15/002; G01R 17/02
See application file for complete search history.

(56) References Cited

U.S. PATENT DOCUMENTS

| | | | | |
|---|---|---|---|---|
| 6,961,266 | B2* | 11/2005 | Chang | G11C 11/5621 365/185.03 |
| 7,206,527 | B2* | 4/2007 | Sasamoto | G03G 15/2039 399/37 |
| 7,446,549 | B2* | 11/2008 | Tomita | G01R 31/3008 324/133 |
| 2005/0222784 | A1 | 10/2005 | Tuff et al. | |
| 2007/0188146 | A1* | 8/2007 | Nakano | H02J 7/0047 320/132 |
| 2014/0036559 | A1* | 2/2014 | Watanabe | G01R 19/00 363/84 |
| 2014/0327718 | A1* | 11/2014 | Kubo | H02M 3/33553 347/19 |
| 2017/0199247 | A1 | 7/2017 | Joe | |
| 2017/0207651 | A1 | 7/2017 | Geng et al. | |

FOREIGN PATENT DOCUMENTS

| | | |
|---|---|---|
| CN | 101655395 A | 2/2010 |
| CN | 102824178 A | 12/2012 |
| CN | 105429249 A | 3/2016 |
| CN | 105628167 A | 6/2016 |
| EP | 2537467 A1 | 12/2012 |
| JP | 2001-193941 A | 7/2001 |
| JP | 2002-13986 A | 1/2002 |
| JP | 2006-204042 A | 8/2006 |
| JP | 2014-81873 A | 5/2014 |
| JP | 2015-141537 A | 8/2015 |
| JP | 2016-101074 A | 5/2016 |
| KR | 2016-0048666 A | 5/2016 |

OTHER PUBLICATIONS

The Second Office Action dated Mar. 8, 2021, of counterpart Chinese Application No. 201880007368.7, along with an English translation.

* cited by examiner

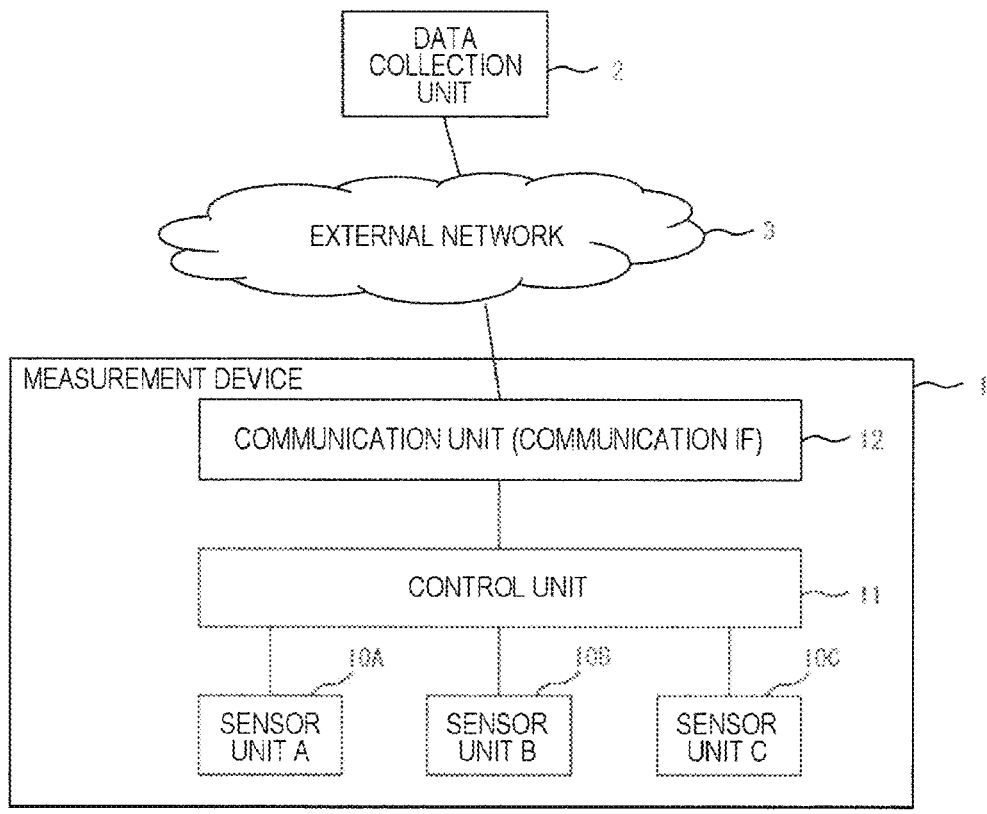

MEASUREMENT DEVICE, MEASUREMENT SYSTEM, MEASUREMENT METHOD, AND PROGRAM

TECHNICAL FIELD

This disclosure relates to a measurement device, a measurement system, a measurement method, and a program that detects a state change of a measurement target.

BACKGROUND

In recent years, various sensors capable of reducing power consumption have been developed. For example, Japanese Unexamined Patent Application Publication No. 2002-13986 discloses a temperature sensor that determines the presence or absence of a temperature change and performs a predetermined process only when a temperature change is detected. The temperature sensor described in JP '986 outputs a voltage corresponding to a measured temperature of an apparatus, compares the output voltage to a reference voltage, and determines the presence or absence of the temperature change on the basis of a comparison result. In addition, only when there is a temperature change, the temperature sensor sets a voltage corresponding to a temperature after change as a reference voltage for a next measurement. In addition, JP '986 describes that, according to the temperature sensor having such a configuration, since the reference voltage is set only when there is a temperature change, current consumption is able to be suppressed.

There is nonetheless a need to ascertain a state of a measurement target only when there is a state change of the measurement target. For example, in a restaurant or the like, there is a need to ascertain the temperature of a measurement target such as a cooking appliance only when there is a temperature change of the measurement target.

In such a situation, when the temperature sensor described in JP '986 is used, it is necessary to first measure the temperature of the measurement target to determine the presence or absence of the temperature change of the measurement target and output the voltage corresponding to the measured temperature. That is, the temperature sensor measures the temperature of the measurement target to determine the presence or absence of the temperature change of the measurement target, which requires power consumption. As described above, the temperature sensor described in JP '986 always measures the state of the measurement target even though the state of the measurement target is described to be ascertained only when there is a state change of the measurement target, and thus there is a problem that the power consumption is increased.

It could therefore be helpful to provide a measurement device, a measurement system, a measurement method, and a program capable of reducing power consumption in various sensors when a state of a measurement target is ascertained when there is a state change of the measurement target.

SUMMARY

We thus provide:

A measurement device includes a sensor unit capable of measuring a state of a measurement target, and a control unit configured to control the sensor unit. The sensor unit includes a measurement unit capable of measuring a voltage corresponding to the state of the measurement target, a first voltage comparison unit configured to determine whether or not the measured voltage is changed beyond a lower limit value of a predetermined voltage change, and a second voltage comparison unit configured to determine whether or not the voltage change is changed beyond an upper limit value of the voltage change. The control unit stops power supply to the sensor unit when it is determined in the first and second voltage comparison units that the measured voltage is not changed beyond the voltage change.

When at least one of the first and second voltage comparison units determines that the measurement voltage is changed beyond the voltage change, the control unit may instruct the measurement unit to measure the state of the measurement target.

The control unit may instruct the sensor unit to measure a voltage corresponding to the state of the measurement target at a timing determined on the basis of an attribute of the sensor unit.

The first voltage comparison unit may compare the measured voltage to the lower limit value of the voltage change to determine whether the measured voltage is changed beyond the lower limit value, and the second voltage comparison unit may compare the measured voltage to the upper limit value of the voltage change to determine whether or not the measured voltage is changed beyond the upper limit value.

The sensor unit may include a first voltage change output unit configured to output the lower limit value of the voltage change to the first voltage comparison unit, and a second voltage change output unit configured to output the upper limit value of the voltage change to the second voltage comparison unit, and the control unit may set the lower limit value of the voltage change to the first voltage change output unit, and may set the upper limit value of the voltage change to the second voltage change output unit.

The measurement device may further include a transmission unit capable of transmitting the state of the measurement target. When one of the first and second voltage comparison units determines that the measured voltage is changed beyond the voltage change, the control unit may transmit the state of the measurement target measured by the measurement unit through the transmission unit.

The measurement device may include a plurality of the sensor units configured to respectively measure the states of different measurement targets, and the control unit may control each of the plurality of sensor units.

A measurement system includes a sensor device capable of measuring a state of a measurement target, and a control device configured to control the sensor device. The sensor device includes a measurement unit capable of measuring a voltage corresponding to the state of the measurement target, a first voltage comparison unit configured to determine whether or not the measured voltage is changed beyond a lower limit value of a predetermined voltage change, and a second voltage comparison unit configured to determine whether or not the voltage change is changed beyond an upper limit value of the voltage change. The control device stops power supply to the sensor unit when it is determined in the first and second voltage comparison units that the measured voltage is not changed beyond the voltage change.

A measurement method according includes a measurement step capable of measuring a voltage corresponding to a state of a measurement target, a first determination step of determining whether or not the measured voltage is changed beyond a lower limit value of a predetermined voltage change, a second determination step of determining whether or not the voltage change is changed beyond an upper limit value of the voltage change, and a stop step of stopping power supply to a sensor unit that measures the voltage when it is determined in the first determination step and the second determination step that the measured voltage is not changed beyond the voltage change.

A non-transitory computer readable medium storing a measurement program causes a computer to execute a measurement function capable of measuring a voltage corresponding to a state of a measurement target, a first determination function of determining whether or not the measured voltage is changed beyond a lower limit value of a predetermined voltage change, a second determination function of determining whether or not the voltage change is changed beyond an upper limit value of the voltage change, and a stop function of stopping power supply to a sensor unit that measures the voltage when it is determined in the first determination function and the second determination function that the measured voltage is not changed beyond the voltage change.

According to the measurement device, the measurement system, the measurement method and the program, it is possible to reduce power consumption of various sensors when a state of a corresponding measurement target is ascertained when there is a state change of the measurement target.

BRIEF DESCRIPTION OF THE DRAWINGS

FIG. 6 is a diagram showing another configuration example of a measurement system.

REFERENCE SIGNS LIST

Figure 1:
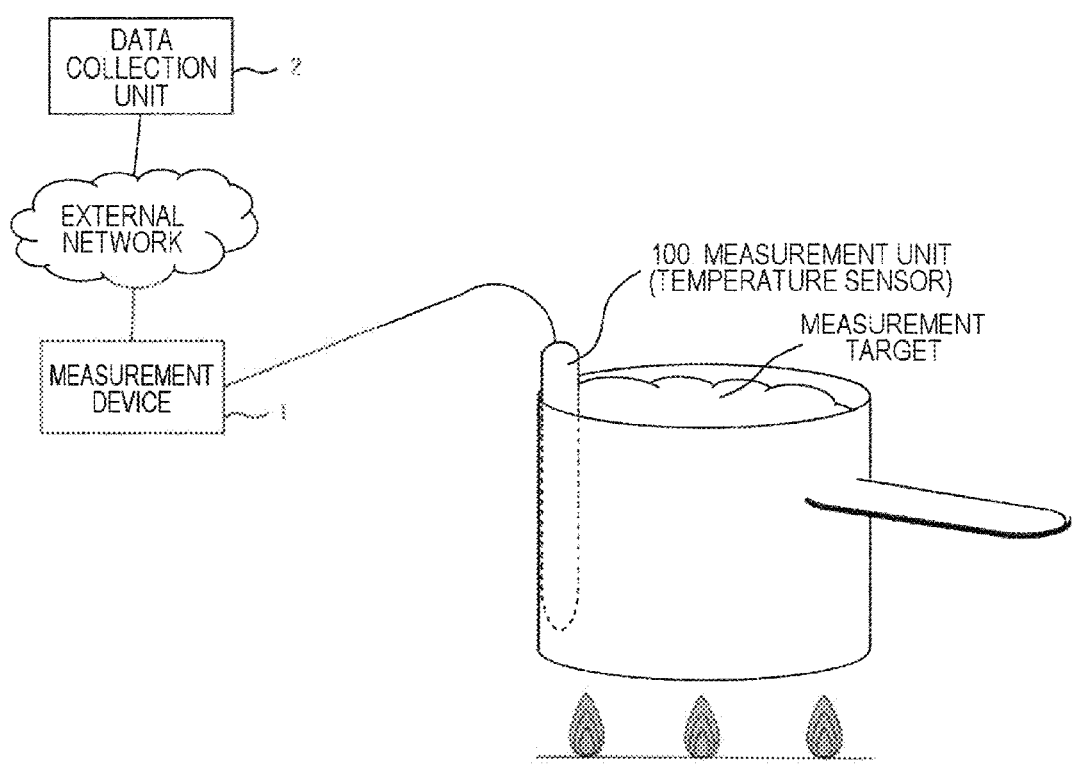
FIG. 1 is a diagram showing a configuration example of a measurement system.

1 Measurement device
2 Data collection device
3 External network
10, 10A, 10B, 10C Sensor unit
11 Control unit
12 Communication unit
100 Measurement unit
101 First voltage comparison unit
102 Second voltage comparison unit
103 First voltage change output unit
104 Second voltage change output unit

DETAILED DESCRIPTION

First Example

The first example will be described with reference to the drawings.

FIG. 1 is a diagram describing an example of use of a measurement system.

As shown in FIG. 1, in the measurement system, for example, in a restaurant or the like, a measurement device 1 measures a state (for example, a temperature or the like) of a food (a measurement target) to be cooked with a cooking appliance such as a pot and notifies a data collection device 2 of the measured state.

A user of the data collection device 2 or the like monitors the state of the food (measurement target) to be cooked with the cooking appliance to determine whether or not the cooking of the food is completed, whether or not the state when cooking the food is appropriate and the like.

In addition, the measurement system reduces power consumption required to measure the state of the measurement target. For example, even though the measurement device 1 is operated by a battery or the like, the measurement system is able to reduce consumption of the battery and extend operation time of the measurement device 1.

Therefore, in the measurement system of the first example, when the state of the measurement target exceeds a predetermined change amount, the state of the measurement target is measured. That is, when the state of the measurement target does not exceed the predetermined change amount, the state of the measurement target is not measured.

In the example of FIG. 1, when a temperature change of the food to be measured is changed beyond a predetermined change amount, the measurement device 1 measures the temperature of the food and notifies the data collection device 2 of the measured temperature. On the other hand, for example, when the temperature change of the food to be measured does not change beyond the predetermined change amount, the measurement system does not measure the temperature of the food to be measured and also does not perform the notification to the data collection device 2.

In the measurement system of the first example, regarding the reduction of the power consumption of the measurement device 1, when, for example, the food to be cooked with the cooking appliance is "rice," and the measurement device 1 measures the weight of the measurement target including the "rice" (that is, a total weight of the rice, water, a cooker and the like) will be described as an example.

The weight of the measurement target including the "rice" (that is, the total weight of the rice, the water, the cooker and the like) does not change for a certain period of time from a start of cooking so much. Therefore, it cannot be said that it is highly necessary for the data collection device 2 to receive the notification of the weight of the measurement target including the "rice" (that is, the total weight of the rice, the water, the cooker and the like), until the weight does not change so much (that is, when the cooking is not so advanced).

On the other hand, the weight of the measurement target including the "rice" (that is, the total weight of the rice, the water, the cooker and the like) is reduced by generation of steam when the cooking has progressed and cooking is close to completion, and thus the change amount of the weight is increased. Therefore, when there is a change in the weight of the measurement target including the "rice" by a predetermined amount or more, it is highly necessary for the data collection device 2 to receive the notification of the weight to ascertain that the cooking of the "rice" is close to completion.

Therefore, in the measurement system of the first example, the data collection device 2 receives the notification of the state of the measurement target when a change amount of the state of the measurement target is changed by a predetermined amount or more. Therefore, in the measurement system of the first example, it is not necessary to measure the state of the measurement target each time a measurement is performed and, at first, it is sufficient to measure whether or not the change of the state of the measurement target is the predetermined amount or more.

In addition, in the measurement system of the first example, the change of the state of the measurement target is determined by a change of a voltage corresponding to the state of the measurement target. Specifically, when the voltage corresponding to the state of the measurement target is greater than an upper limit value or less than a lower limit value of a predetermined voltage change, the measurement device 1 determines that the change amount of the state of the measurement target is equal to or greater than the predetermined amount, and shifts to the measurement of the state of the measurement target. On the other hand, when the voltage corresponding to the state of the measurement target is equal to or less than the upper limit value or equal to or greater than the lower limit value of the predetermined voltage change, the measurement device 1 determines that the change amount of the state of the measurement target is less than the predetermined amount, and does not perform the measurement of the state of the measurement target.

Therefore, in the measurement system of the first example, the measurement device 1 measures the state of the measurement target when the change amount of the state of the measurement target is changed by the predetermined amount or more, and thus it is possible to reduce the power consumption required for the measurement device 1.

Figure 2:
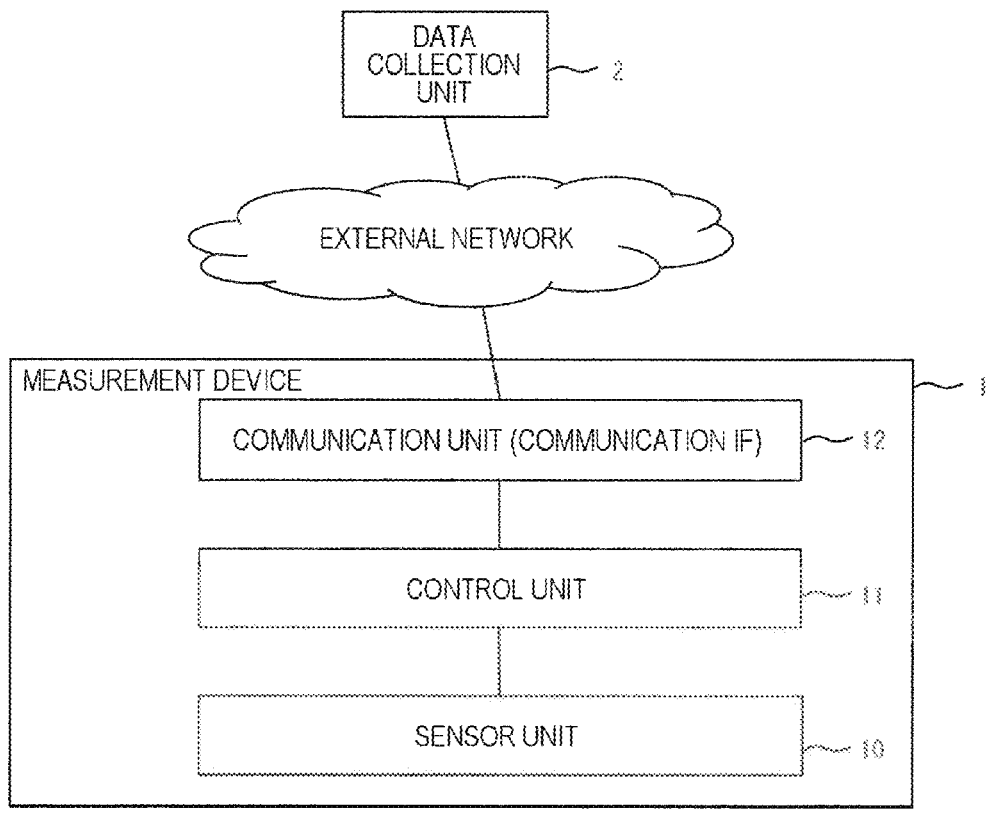
FIG. 2 is a diagram showing a configuration example of a measurement system related to a use situation of a measurement device.

FIG. 2 is a diagram showing an example of the measurement system. As shown in FIG. 2, the measurement system includes the measurement device 1 and the data collection device 2.

The data collection device 2 is a device that collects the state of the measurement target. The data collection device 2 is, for example, a server, a laptop computer, a personal digital assistant (PDA), a portable multimedia player (PMP), a navigation device, a slate PC, a tablet PC, an ultrabook, a wearable device, a mobile phone, a smart phone or the like. The data collection device 2 is not limited to these examples. The data collection device 2 may be any device.

The data collection device 2 collects a measurement result of the state of the measurement target when the state of the measurement target is changed by the predetermined amount. For example, when a temperature of the measurement target is changed by 1° C. or more, the data collection device 2 collects the measurement result of the temperature of the measurement target. The 1° C. that is the change amount of the temperature is an example and any change amount may be used.

In addition, when a weight of the measurement target is changed by 100 g or more, the data collection device 2 collects a measurement result of the weight of the measurement target. The 100 g that is the change amount of the weight is an example and any change amount may be used. In addition, when power of the measurement target is changed by 10 W or more, the data collection device 2 collects a measurement result of the power of the measurement target. The 10 W that is the change amount of the power is an example and any change amount may be used.

As shown in FIG. 2, the measurement device 1 includes a sensor unit 10, a control unit 11, and a communication unit 12.

The sensor unit 10 has a function of measuring the state of the measurement target. The state of the measurement target is, for example, the temperature, the weight, the power or the like of the measurement target. For example, when it is desired to measure the temperature of the measurement target, the sensor unit 10 is a temperature sensor. In addition, when it is desired to measure the weight of the measurement target, the sensor unit 10 is a weight sensor. In addition, when it is desired to measure the power of the measurement target, the sensor unit 10 is a voltage sensor. The state of the measurement target measured by the sensor unit 10 is not limited to these examples, and may be any state. In addition, the sensor unit 10 may be provided for each of the states of the measurement target.

Figure 3:
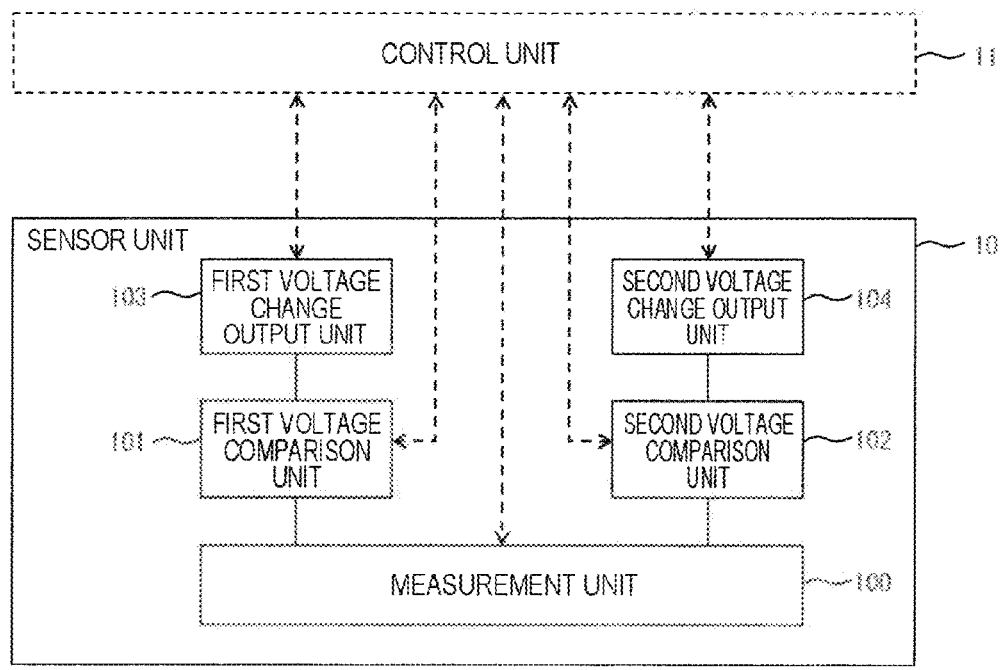
FIG. 3 is a diagram showing a configuration example of a sensor unit.

As shown in FIG. 3, the sensor unit 10 includes a measurement unit 100, a first voltage comparison unit 101, a second voltage comparison unit 102, a first voltage change output unit 103, and a second voltage change output unit 104.

The measurement unit 100 is able to measure the voltage corresponding to the state of the measurement target. The measurement unit 100 is able to measure, for example, a voltage corresponding to the temperature of the measurement target.

Similarly, the measurement unit 100 is able to measure, for example, a voltage corresponding to the weight of the measurement target. Furthermore, the measurement unit 100 is able to measure, for example, the power of the measurement target.

In addition, the measurement unit 100 is able to measure the state of the measurement target. For example, the measurement unit 100 is able to measure the state itself of the measurement target from the voltage corresponding to the state of the measurement target. Similarly, the measurement unit 100 is able to measure, for example, the weight of the measurement target. In addition, the measurement unit 100 is able to measure the power of the measurement target. The state of the measurement target that is able to be measured by the sensor unit 10 is not limited to these examples, and may be any state.

A measurement time of the measurement of the voltage corresponding to the state of the measurement target by the measurement unit 100 is shorter than a measurement time of the state itself of the measurement target. For example, the measurement unit 100 is able to measure the state of the measurement target in one hundredth ($\frac{1}{100}$) of the measurement time of the state of the measurement target itself.

Therefore, in the first example, first, the measurement unit 100 measures the voltage corresponding to the state of the measurement target, and when the measured voltage is changed beyond a predetermined voltage change, the measurement unit 100 shifts to the measurement of the state of the measurement target. On the other hand, when the measured voltage is not changed beyond the predetermined voltage change, the measurement unit 100 does not measure the state of the measurement target. Therefore, when the voltage corresponding to the state of the measurement target is not changed beyond the predetermined voltage change, the measurement unit 100 does not measure the state itself of the measurement target and, thus, the measurement time is able to be significantly reduced. Therefore, the measurement unit 100 is able to reduce the power consumption required for the measurement.

The first voltage comparison unit 101 determines whether or not the voltage measured by the measurement unit 100 is changed beyond the lower limit value of the predetermined voltage change. For example, the first voltage comparison unit 101 determines whether or not a voltage corresponding to the temperature of the measurement target measured by the measurement unit 100 is less than the lower limit value 0.2 V of the voltage change related to a predetermined temperature.

In addition, the first voltage comparison unit 101 determines, for example, whether or not a voltage corresponding to the weight of the measurement target measured by the measurement unit 100 is less than the lower limit value of the voltage change related to a predetermined weight. Furthermore, the first voltage comparison unit 101 determines, for example, whether or not a voltage corresponding to the power of the measurement target measured by the measurement unit 100 is less than the lower limit value of the voltage change related to a predetermined power. The determination by the first voltage comparison unit 101 is not limited to these examples, and may be any determination.

The first voltage comparison unit 101 notifies the control unit 11 of a determination result of whether or not the voltage measured by the measurement unit 100 is changed beyond the lower limit value of the predetermined voltage change.

The second voltage comparison unit 102 determines whether or not the voltage measured by the measurement unit 100 is changed beyond the upper limit value of the predetermined voltage change. For example, the second voltage comparison unit 102 determines whether or not the voltage corresponding to the temperature of the measurement target measured by the measurement unit 100 is greater than the upper limit value 0.2 V of the voltage change related to the predetermined temperature.

In addition, the second voltage comparison unit 102 determines, for example, whether or not the voltage corresponding to the weight of the measurement target measured by the measurement unit 100 is greater than the upper limit value of the voltage change related to the predetermined weight. Furthermore, the second voltage comparison unit 102 determines, for example, whether or not the voltage corresponding to the power of the measurement target measured by the measurement unit 100 is greater than the upper limit value of the voltage change related to the predetermined power. The determination by the second voltage comparison unit 102 is not limited to these examples, and may be any determination.

The second voltage comparison unit 102 notifies the control unit 11 of the determination result of whether or not the voltage measured by the measurement unit 100 is changed beyond the upper limit value of the predetermined voltage change.

The first voltage change output unit 103 outputs the lower limit value of the voltage change to the first voltage comparison unit 101. For example, in the sensor unit 10 that measures the temperature of the measurement target, the first voltage change output unit 103 outputs the lower limit value of the predetermined voltage change related to the temperature to the first voltage comparison unit 101.

In addition, for example, in the sensor unit 10 that measures the weight of the measurement target, the first voltage change output unit 103 outputs the lower limit value of the predetermined voltage change related to the weight to the first voltage comparison unit 101. Furthermore, in addition, for example, in the sensor unit 10 that measures the power of the measurement target, the first voltage change output unit 103 outputs the lower limit value of the predetermined voltage change related to the power to the first voltage comparison unit 101. The output by the first voltage change output unit 103 is not limited to these examples, and may be any output.

The second voltage change output unit 104 outputs the upper limit value of the voltage change to the second voltage comparison unit 102. For example, in the sensor unit 10 that measures the temperature of the measurement target, the second voltage change output unit 104 outputs the upper limit value of the predetermined voltage change related to the temperature to the second voltage comparison unit 102.

In addition, for example, in the sensor unit 10 that measures the weight of the measurement target, the second voltage change output unit 104 outputs the upper limit value of the predetermined voltage change related to the weight to the second voltage comparison unit 102. Furthermore, in addition, for example, in the sensor unit 100 that measures the power of the measurement target, the second voltage change output unit 104 outputs the upper limit value of the predetermined voltage change related to the power to the second voltage comparison unit 102. Note the output by the second voltage change output unit 104 is not limited to these examples, and may be any output.

The control unit 11 has a function of controlling the sensor unit 10. The control unit 11 controls power supply to the sensor unit 10. The control unit 11 stops the power supply to the sensor unit 10 except when the sensor unit 10 performs the measurement related to the state of the measurement target. As a result, the control unit 11 is able to reduce the power consumption of the sensor unit 10.

The control unit 11 supplies power to the sensor unit 10 at a predetermined timing, and causes the sensor unit 10 to measure the voltage corresponding to the state of the measurement target. The predetermined timing is, for example, a predetermined period. The predetermined period is, for example, one second. The predetermined period is not limited to one second, and may be any period. In addition, the predetermined timing is not limited to the predetermined period, and may be any timing such when there is a request for the measurement.

In addition, when it is determined in the first voltage comparison unit 101 and the second voltage comparison unit 102 that the voltage change is not changed beyond the voltage change, the control unit 11 stops the power supply to the sensor unit 10.

Figure 4:
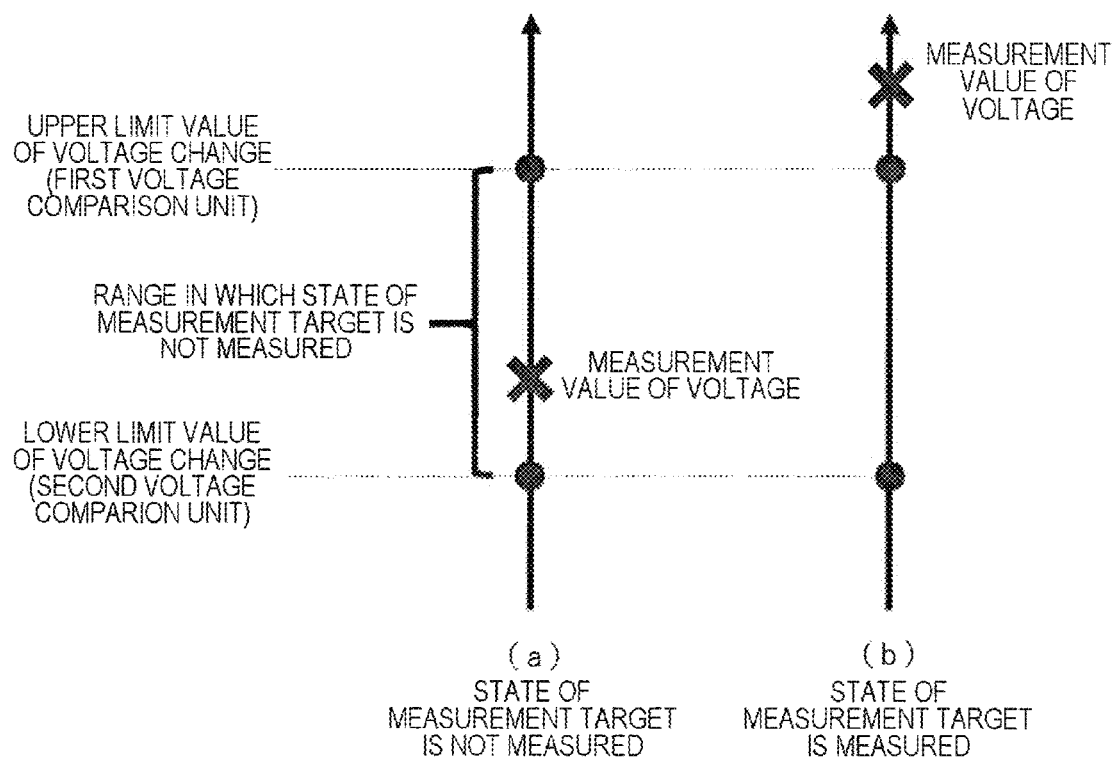
FIG. 4 is a diagram showing an outline of determination of a voltage change.

FIG. 4 is a diagram showing an outline of determination of a voltage change in the first example. As shown in FIG. 4 on the left hand side marked (a) STATE OF MEASUREMENT TARGET IS NOT MEASURED, when the voltage corresponding to the state of the measurement target measured by the measurement unit 100 is equal to or less than the upper limit value of the predetermined voltage change and is equal to or greater than the lower limit value of the predetermined voltage change, the control unit 11 stops the power supply to the sensor unit 10 and does not measure the state of the measurement target.

On the other hand, as shown in FIG. 4 on the right hand side marked (b) STATE OF MEASUREMENT TARGET IS MEASURED, when the voltage corresponding to the state of the measurement target measured by the measurement unit 100 is greater than the upper limit value of the predetermined voltage change or is less than the lower limit value of the predetermined voltage change, the control unit 11 continues the power supply to the sensor unit 110 and causes the sensor unit 10 to measure the state of the measurement target.

The time for detecting the change of the voltage in the measurement unit 100 is able to be measured in one hundredth ($1/100$) of the measurement time compared to the state itself of the measurement target. Therefore, when the voltage corresponding to the state of the measurement target measured by the measurement unit 100 is equal to or less than the upper limit value of the predetermined voltage change and is equal to or greater than the lower limit value of the predetermined voltage change (that is, in FIG. 4), the control unit 11 is able to reduce the power consumption in the sensor unit 10.

On the other hand, when one of the first and second voltage comparison units determines that the voltage is changed beyond the voltage change, the control unit 11 continues the power supply to the measurement unit 100. As a result, the measurement unit 100 measures the state itself of the measurement target (for example, the temperature, the weight, the power or the like).

In addition, the control unit 11 sets the lower limit value of the voltage change to the first voltage change output unit 103. For example, in the sensor unit 10 that measures the temperature of the measurement target, the control unit 11 sets the lower limit value of the change amount of the voltage corresponding to the temperature to the first voltage change output unit 103.

On the other hand, the control unit 11 sets the upper limit value of the voltage change with respect to the second voltage change output unit 104. For example, in the sensor unit 10 that measures the temperature of the measurement target, the control unit 11 sets the upper limit value of change amount of the voltage corresponding to the temperature with respect to second voltage change output unit 104.

In addition, when the control unit 11 is notified of the measurement result of the state itself of the measurement target from the measurement unit 100, the control unit 11 notifies the data collection device 2 of the measurement result through the communication unit 12.

The communication unit 12 is a communication interface. For example, the communication unit 12 is a wireless Internet module or a mobile communication module such as wireless LAN (WLAN), wireless fidelity (WiFi) direct, digital living network alliance (DLNA, registered trademark), wireless broadband (Wibro), world interoperability for microwave access (Wimax), or high speed downlink packet access (HSDPA).

In addition, the communication unit 12 may be a short range communication module such as a Bluetooth (registered trademark), radio frequency identification (RFID), infrared communication (infrared data association; IrDA), ultra wideband (UWB), ZigBee, or near field communication (NFC) module.

Operation Example

Figure 5:
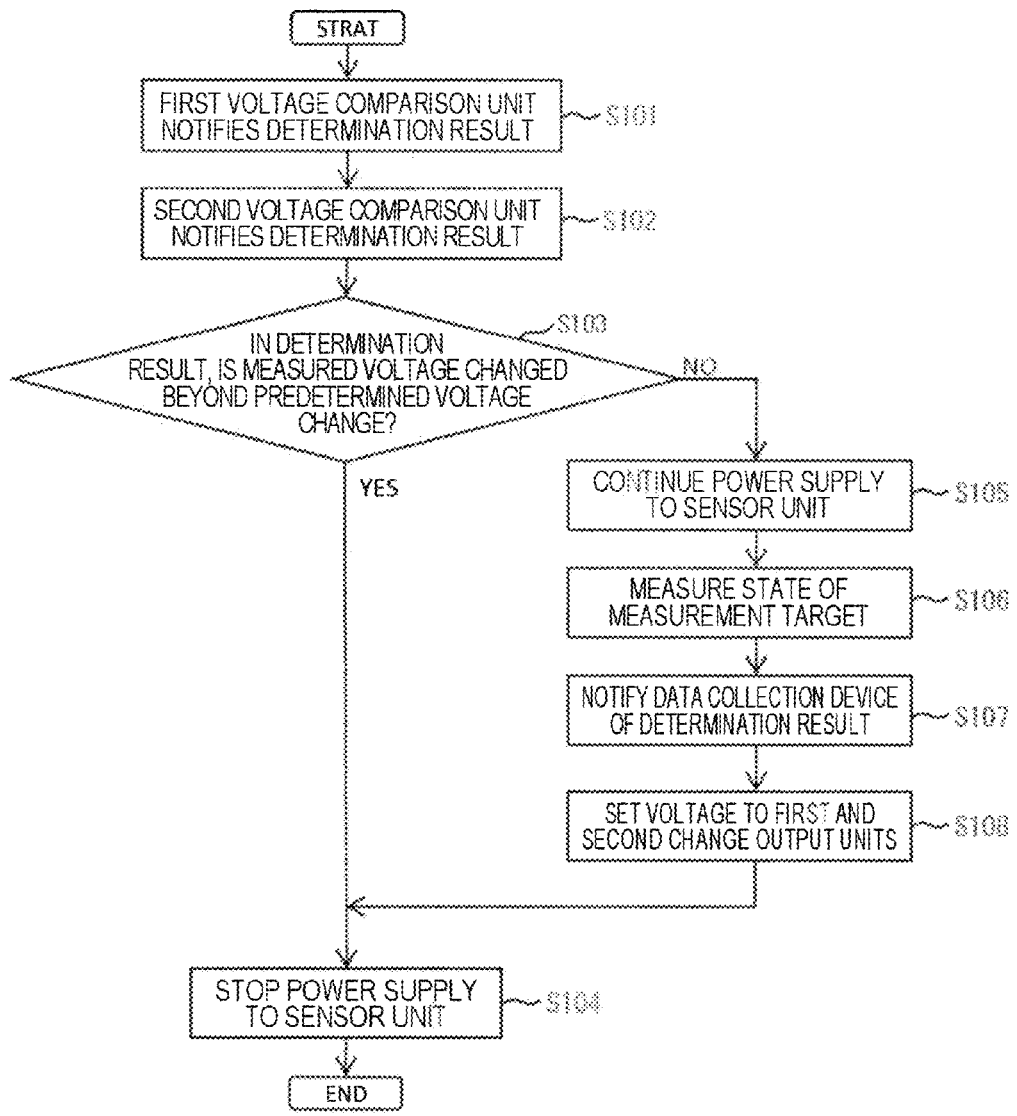
FIG. 5 is a flowchart showing an operation example of the measurement device.

FIG. 5 is a flowchart showing an operation example of the measurement device 1 in the first example.

The first voltage comparison unit 101 determines whether or not the measurement target is changed beyond the lower limit value of the predetermined voltage change, and notifies the control unit 11 of the determination result (S101).

Similarly, the second voltage comparison unit 102 determines whether or not the measurement target is changed beyond the upper limit value of the predetermined voltage change, and notifies the control unit 11 of the determination result (S102).

The control unit 11 determines whether or not the first voltage comparison unit 101 and the second voltage comparison unit 102 determine that the measurement target is changed beyond the voltage change (S103). When the control unit 11 determines a fact that the first voltage comparison unit 101 and the second voltage comparison unit 102 determine that the measurement target is not changed beyond the voltage change (YES of S103), the control unit 11 stops the power supply to the sensor unit 10 (S104).

On the other hand, when the control unit 11 determines that the first voltage comparison unit 101 and the second voltage comparison unit 102 determine that the measurement target is changed beyond the voltage change (NO of S103), the control unit 11 continues the power supply to the sensor unit 10 (S105).

When the control unit 11 continues the power supply to the sensor unit 10, the measurement unit 100 of the sensor unit 10 measures the state of the measurement target (S106).

When the control unit 11 is notified of the measurement result of the state of the measurement target from the measurement unit 100, the control unit 11 notifies the data collection device 2 of the measurement result through the communication unit 12 (S107).

The control unit 11 sets the lower limit value of the voltage to the first voltage change output unit 103 and sets the upper limit value of the voltage to the second voltage change output unit 104 on the basis of the notified measurement result (S108).

When the control unit 11 is notified of the measurement result of the state of the measurement target from the measurement unit 10, the control unit 11 stops the power supply to the sensor unit 10 (S104).

As described above, in the first example, the first voltage comparison unit 101 and the second voltage comparison unit 102 compare the voltage of the measurement target with a predetermined voltage value, and when the voltage is not changed beyond the predetermined voltage value, the power supply to the sensor unit 10 is immediately stopped. The power required to compare the voltages is significantly less than the power required to measure the state of the measurement target. Therefore, only when state change (the voltage change) of the measurement target is large, does the measurement device 1 measure the state of the measurement target. When the state change of the measurement target is small, that is, when the power change of the measurement target is small, the measurement device 1 ends the process only by the voltage comparison. In other words, the measurement device 1 measures the state of the measurement target only when the state change of the measurement target is large, and ends the process only by the voltage comparison in other instances. As a result, the measurement device 1 is able to reduce the power consumption in various sensors.

Second Example

The second example shows when the measurement device 1 includes a plurality of sensor units 10.

FIG. 6 is a diagram showing a configuration of the measurement device 1 in the second example. As shown in FIG. 6, the measurement device 1 includes a plurality of sensor units 10.

Each of the plurality of sensor units 10 is able to measure different states of the measurement target. For example, a sensor unit 10A executes the measurement related to the temperature of the measurement target. In addition, a sensor unit 10B executes, for example, the measurement related to the weight of the measurement target. In addition, a sensor unit 10C executes, for example, the measurement related to the voltage of the measurement target.

The number of sensor units 10 included in the measurement device 1 may be any number, and the sensor unit 10 may be provided according to the number of states of the measurement target desired to be measured.

The control unit 11 is able to control, for example, periods, in which the measurement related to the state of the measurement target is executed, independently of one another for each of the plurality of sensor units 10. For example, the control unit 11 supplies the power to the sensor unit 10A capable of measuring the temperature of the measurement target at a predetermined period A, and causes the sensor unit 10A to execute the measurement related to the temperature.

In addition, for example, the control unit 11 supplies the power to the sensor unit 10B capable of measuring the weight of the measurement target at a predetermined period B, and causes the sensor unit 10B to execute the measurement related to the weight. In addition, for example, the control unit 11 supplies the power to the sensor unit 10C capable of measuring the voltage of the measurement target at a predetermined period C, and causes the sensor unit 10C to execute the measurement related to the voltage.

As described above, the control unit 11 is able to supply the power to the sensor unit 10 on the basis of a measurement frequency of the state of the measurement target, and is able to cause the sensor unit 10 to execute the measurement according to the measurement frequency. As a result, the power is able to be supplied to the sensor unit 10 at an appropriate timing based on the measurement frequency of the state of the measurement target, it is possible to reduce the power consumption of the entire measurement device 1.

In addition, for example, with respect to each of the plurality of sensor units 10, the control unit 11 determines whether or not the first voltage comparison unit 101 and the second voltage comparison unit 102 determine that the measured voltage is not changed beyond the voltage change, independently from each other. In addition, with respect to each of the plurality of sensor units 10, the control unit 11 determines whether or not to stop the power supply to the sensor unit 10, independently from each other.

In addition, for example, with respect to each of the plurality of sensor units 10, the control unit 11 is able to set the lower limit value of the voltage change of the first voltage change output unit 103 and the upper limit value voltage change of the second voltage change output unit 104, independently from each other.

For example, the control unit 11 sets the lower limit value of the voltage corresponding to the temperature to the first voltage change output unit 103 of the sensor unit 10A that is able to measure the temperature of the measurement target. In addition, the control unit 11 sets the upper limit value of the voltage corresponding to the temperature to the second voltage change output unit 104 of the sensor unit 10A that is able to measure the temperature of the measurement target.

In addition, the control unit 11 sets the lower limit value of the voltage corresponding to the weight to a first voltage change output unit 103B of the sensor unit 10B that is able to measure the weight of the measurement target. The control unit 11 sets the upper limit value of the voltage corresponding to the weight to a second voltage change output unit 104B of the sensor unit 10B that is able to measure the weight of the measurement target. Furthermore, the control unit 11 sets the lower limit value of the voltage corresponding to the power to a first voltage change output unit 103C of the sensor unit 10C that is able to measure the power of the measurement target. The control unit 11 sets the upper limit value of the voltage corresponding to the power to a second voltage change output unit 104C of the sensor unit 10C that is able to measure the power of the measurement target.

In addition, for example, when the control unit 11 is notified of the measurement result of the state of the measurement target from each of the plurality of sensor units 10, the control unit 11 notifies the data collection device 2 of the measurement result through the communication unit 12.

For example, when the control unit 11 is notified of the temperature from the sensor unit 10A, the control unit 11 notifies the data collection device 2 of the temperature through the communication unit 12. In addition, when the control unit 11 is notified of the weight from the sensor unit 10B, the control unit 11 notifies the data collection device 2 of the weight through the communication unit 12. Furthermore, when the control unit 11 is notified of the power from the sensor unit 10C, the control unit 11 notifies the data collection device 2 of the power through the communication unit 12.

As described above, in the second example, since the measurement device 1 includes a plurality of measurement devices and the plurality of measurement devices are able to be controlled independently from each other, different states are able to be measured for the measurement target.

In addition, the measurement device 1 may be realized by a logic circuit (hardware) formed in an integrated circuit (IC chip) or the like, or may be realized by software using a central processing unit (CPU). In the latter example, the measurement device 1 includes a CPU that executes an instruction of a program that is software that realizes each function, a read only memory (ROM) or a storage device (these are referred to as "recording medium") in which the program and various pieces of data are readably recorded by an information processing device (or CPU), and a random access memory (RAM) that develops the program and the like. We provide the information processing device (or CPU) reading and execute the program from the recording medium. In addition, the program may be provided to the information processing device through an arbitrary transmission medium (communication network, broadcast wave or the like) capable of transmitting the program. We also provide a data signal embedded in a carrier wave in which the program is embodied by electronic transmission.

The program is able to be implemented using, for example, a script language such as ActionScript or JavaScript (registered trademark), an object-oriented programming language such as Objective-C or Java (registered trademark), or a markup language such as HTML5. A game system including a portable terminal (for example, the measurement device 1) including each configuration unit that realizes each function realized by the program and a server including each configuration unit that realizes remaining functions different from the each function is also within the scope of this disclosure.

Although my devices, systems, methods and programs have been described on the basis of the drawings and examples, those skilled in the art can easily make various changes and modifications based on the disclosure. Therefore, such changes and modifications are included in the scope of this disclosure. For example, each means, functions included in each step or the like can be rearranged to not be logically contradictory, and it is possible to combine a plurality of means, steps or the like into one or divide one means, step or the like into a plurality of means, steps or the like. In addition, the configurations described may be combined as appropriate.

The invention claimed is:
1. A measurement device comprising:
a sensor unit capable of measuring a state of a measurement target; and
a control unit configured to control the sensor unit,
wherein the sensor unit comprises:
a measurement unit capable of measuring a voltage corresponding to the state of the measurement target;

a first voltage comparison unit configured to determine whether or not the measured voltage is changed beyond a lower limit value of a predetermined voltage change;

a second voltage comparison unit configured to determine whether or not the measured voltage is changed beyond an upper limit value of the predetermined voltage change, and the control unit stops power supply to the sensor unit when it is determined in the first and second voltage comparison units that the measured voltage is not changed beyond the upper limit value of the predetermined voltage change and beyond the lower limit value of the predetermined voltage change.

2. The measurement device according to claim 1, wherein, when at least one of the first and second voltage comparison units determines that the measured voltage is changed beyond the upper limit value of the predetermined voltage change and beyond the lower limit value of the predetermined voltage change, the control unit instructs the measurement unit to measure the state of the measurement target, and the measurement unit measures the state of the measurement target.

3. The measurement testing device according to claim 1, wherein the control unit instructs the sensor unit to measure a voltage corresponding to the state of the measurement target at a timing determined on the basis of an attribute of the sensor unit.

4. The measurement device according to claim 1, wherein the first voltage comparison unit compares the measured voltage with the lower limit value of the predetermined voltage change to determine whether the measured voltage is changed beyond the lower limit value, and the second voltage comparison unit compares the measured voltage with the upper limit value of the predetermined voltage change to determine whether or not the measured voltage is changed beyond the upper limit value.

5. The measurement device according to claim 1, wherein the sensor unit further comprises:

a first voltage change output unit configured to output the lower limit value of the predetermined voltage change to the first voltage comparison unit;

a second voltage change output unit configured to output the upper limit value of the predetermined voltage change to the second voltage comparison unit, and the control unit sets the lower limit value of the predetermined voltage change to the first voltage change output unit, and sets the upper limit value of the predetermined voltage change to the second voltage change output unit.

6. The measurement device according to claim 1, further comprising:

a transmission unit capable of transmitting the state of the measurement target, wherein, when one of the first and second voltage comparison units determines that the measured voltage is changed beyond the predetermined voltage change, the control unit transmits the state of the measurement target measured by the measurement unit through the transmission unit.

7. The measurement device according to claim 1, comprising:

a plurality of the sensor units configured to measure the states of different measurement targets, wherein the control unit controls each of the plurality of sensor units.

8. A measurement system comprising:

a sensor device capable of measuring a state of a measurement target; and a control device configured to control the sensor device, wherein the sensor device comprises:

a measurement unit capable of measuring a voltage corresponding to the state of the measurement target;

a first voltage comparison unit configured to determine whether or not the measured voltage is changed beyond a lower limit value of a predetermined voltage change;

a second voltage comparison unit configured to determine whether or not the measured voltage is changed beyond an upper limit value of the predetermined voltage change, and the control device stops power supply to the sensor unit when it is determined in the first and second voltage comparison units that the measured voltage is not changed beyond the upper limit value of the predetermined voltage change and beyond the lower limit value of the predetermined voltage change.

9. A measurement method comprising:

a measurement step capable of measuring a voltage corresponding to a state of a measurement target;

a first determination step of determining whether or not the measured voltage is changed beyond a lower limit value of a predetermined voltage change;

a second determination step of determining whether or not the measured voltage is changed beyond an upper limit value of the predetermined voltage change; and a stop step of stopping power supply to a sensor unit that measures the voltage when it is determined in the first determination step and the second determination step that the measured voltage is not changed beyond the upper limit value of the predetermined voltage change and beyond the lower limit value of the predetermined voltage change.

10. A non-transitory computer readable medium storing a program therein, the program causing a computer to execute:

a measurement function capable of measuring a voltage corresponding to a state of a measurement target;

a first determination function of determining whether or not the measured voltage is changed beyond a lower limit value of a predetermined voltage change;

a second determination function of determining whether or not the measured voltage is changed beyond an upper limit value of the predetermined voltage change; and a stop function of stopping power supply to a sensor unit that measures the voltage when it is determined in the first determination function and the second determination function that the measured voltage is not changed beyond the upper limit value of the predetermined voltage change and beyond the lower limit value of the predetermined voltage change.

* * * * *